United States Patent
Zheng et al.

(10) Patent No.: US 6,465,373 B1
(45) Date of Patent: Oct. 15, 2002

(54) ULTRA THIN TCS (SICL$_4$) CELL NITRIDE FOR DRAM CAPACITOR WITH DCS (SIH$_2$CL$_2$) INTERFACE SEEDING LAYER

(75) Inventors: Lingyi A. Zheng, Boise; Er-Xuan Ping, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/653,523

(22) Filed: Aug. 31, 2000

(51) Int. Cl.$^7$ .............................................. H01L 21/469
(52) U.S. Cl. ........................ 438/794; 438/791; 438/793
(58) Field of Search ................... 438/791, 793, 438/794, 786

(56) References Cited

U.S. PATENT DOCUMENTS

| | | | |
|---|---|---|---|
| 4,963,506 A | 10/1990 | Liaw et al. ................ | 438/482 |
| 5,663,087 A | * 9/1997 | Yokozawa .................. | 438/762 |
| 5,882,978 A | 3/1999 | Srinivasan et al. ......... | 438/396 |
| 5,939,333 A | 8/1999 | Hurley et al. .............. | 438/241 |
| 5,981,404 A | * 11/1999 | Sheng et al. ................ | 438/791 |
| 6,027,984 A | 2/2000 | Thakur et al. .............. | 438/440 |
| 6,063,713 A | 5/2000 | Doan ......................... | 438/763 |
| 6,077,754 A | 6/2000 | Srinivasan et al. ......... | 438/396 |
| 6,147,013 A | * 11/2000 | Sun et al. ................... | 438/791 |
| 7,171,977 | * 1/2001 | Kasai et al. ................ | 438/775 |
| 6,258,690 B1 | * 7/2001 | Zenke ......................... | 438/396 |
| 6,268,299 B1 | * 7/2001 | Jammy et al. .............. | 438/791 |
| 6,284,583 B1 | * 9/2001 | Saida et al. ................. | 438/216 |

* cited by examiner

Primary Examiner—Trung Dang
(74) Attorney, Agent, or Firm—Whyte Hirschboeck Dudek SC

(57) ABSTRACT

A method for forming silicon nitride films on semiconductor devices is provided. In one embodiment of the method, a silicon-comprising substrate is first exposed to a mixture of dichlorosilane (DCS) and a nitrogen-comprising gas to deposit a thin silicon nitride seeding layer on the surface, and then exposed to a mixture of silicon tetrachloride (TCS) and a nitrogen comprising gas to deposit a TCS silicon nitride layer on the DCS seeding layer. In another embodiment, the method involves first nitridizing the surface of the silicon-comprising substrate prior to forming the DCS nitride seeding layer and the TCS nitride layer. The method achieves a TCS nitride layer having a sufficient thickness to eliminate bubbling and punch-through problems and provide high electrical performance regardless of the substrate type. Also provided are methods of forming a capacitor, and the resulting capacitor structures.

54 Claims, 8 Drawing Sheets

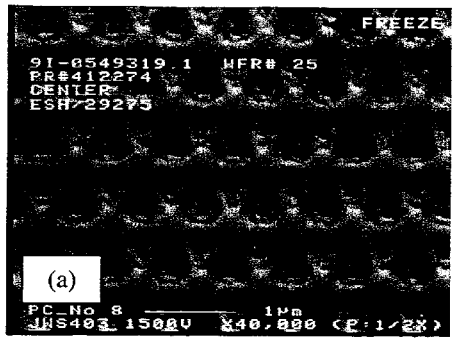
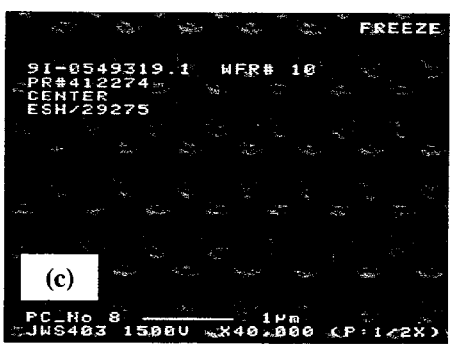
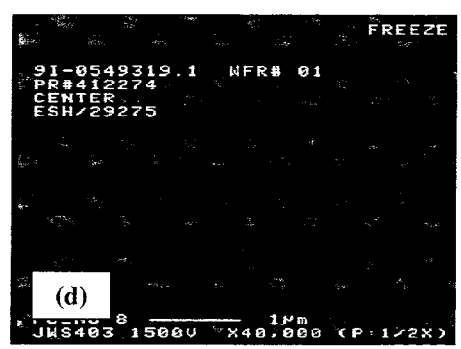
FIGS. 4a-4-f

ULTRA THIN TCS (SICL$_4$) CELL NITRIDE FOR DRAM CAPACITOR WITH DCS (SIH$_2$CL$_2$) INTERFACE SEEDING LAYER

TECHNICAL FIELD

The present invention relates to the fabrication of integrated circuit devices, and more particularly, to methods of forming silicon nitride layers on silicon-comprising substrate surfaces, methods of forming capacitors, and to capacitor constructions.

BACKGROUND OF THE INVENTION

Silicon nitride (Si$_3$N$_4$) layers are frequently used in the fabrication of semiconductor wafers, for example, in the fabrication of MOSFET gates, memory cells, and precision capacitors. Silicon nitride layers are utilized as an insulation layer over silicon surfaces to electrically isolate conductive components of a semiconductor circuit from one another. Silicon nitride films are also used as a diffusion barrier to protect regions of a semiconductor wafer during local oxidation of silicon due to the slow speed with which oxygen and water vapor diffuse in the nitride. Silicon nitride dielectric films are preferred over silicon dioxide (SiO$_2$) in many applications due to its high dielectric constant (6–9 versus about 4.2 for chemical vapor deposited (CVD) SiO$_2$).

Capacitors are commonly-used electrical components of semiconductor circuitry. A typical capacitor is constructed of two conductive plates separated by a non-conducting dielectric layer. The capacitor is electrically connected to a circuit external of the capacitor. The dielectric layer is preferably comprised of one or more materials having a very high dielectric constant and low leakage current characteristics, for example, SiO$_2$ and Si$_3$N$_4$, with Si$_3$N$_4$ being typically preferred due to its higher dielectric constant.

Silicon nitride is typically deposited upon a silicon surface (including, but not limited to, single crystal, poly, and epitaxial), by low pressure chemical vapor deposition (LPCVD). In a conventional silicon nitride LPCVD deposition, the silicon surface is normally pretreated, for example, by removing the native oxide using a hydrofluoric acid (HF) clean solution. A film of silicon nitride is then deposited on the pretreated surface by LPCVD by reacting dichlorosilane (SiH$_2$Cl$_2$) and ammonia (NH$_3$) over the silicon surface in a hot-wall reactor at about 600 to about 800° C. and a pressure of about 100 mTorr to about 2 Torr.

An alternate process for producing a Si$_3$N$_4$ layer is by rapid thermal nitridation (RTN) of a silicon layer which is annealed in an NH$_3$ or other nitrogen-comprising atmosphere, which reacts with the silicon to produce silicon nitride. However, the growth of the nitride is extremely slow and self-limiting since the NH$_3$ is not capable of adequately diffusing through the growing silicon nitride layer to react with the underlying silicon. The ultimate thickness of a silicon nitride film produced by nitridation is typically only 3 to 4 nm at high temperatures. Such thickness is usually too low to adequately function as a barrier to prevent further oxidation of the silicon surface during subsequent processing, or as a capacitor dielectric layer between two conductive capacitor plates. Further, the electrical quality of this high temperature nitridated layer is poor.

Another described technique for formation of Si$_3$N$_4$ capacitor dielectric layers is to initially nitridize an outer silicon surface to obtain a 20 to 30 angstrom thick layer, and then deposit a silicon nitride film by low pressure chemical vapor deposition of DCS. The drawbacks of these methods include poor electrical performance of the RTN/DCS layer and high thermal budget induced from the high temperature RTN process.

Surface properties of the wafer surface play an important role in the initial growth of films in thin-film processes, which will impact the properties and structure of the thin film that is deposited. Different nucleation and deposition rates occur for the deposition of silicon nitride on different wafer surfaces. This leads to different or degraded electrical characteristics of semiconductor devices having different wafer surfaces that are fabricated using a silicon nitride deposited layer. In addition, deposition of silicon nitride also includes an incubation time at the start of the deposition where there is no apparent deposition of silicon nitride. The incubation time may extend up to several minutes for some surfaces. Surfaces exhibiting such different rates and incubation times include, but are not limited to, one or more of tetraethylorthosilicate (TEOS), borophosphosilicate glass (BPSG), silicon, polysilicon, hemispherical grain (HSG) polysilicon, other doped silicon or polysilicon surfaces, other doped oxides, thermal silicon dioxide, chemical vapor deposited (CVD) silicon dioxide, and plasma enhanced CVD (PECVD) silicon dioxide.

TCS nitride layers (SiCL$_4$ reached with NH$_3$) have been shown to have much better capacitance (Cp)leakage performance than silicon nitride layers produced by dichlorosilane (DCS) in DRAM capacity modules. However, there have been problems with nucleation of TCS nitride on certain silicon-based surfaces such as borophosphosilicate glass (BPSG) using current TCS cell nitride processes.

An example of a prior art process for depositing a TCS silicon nitride layer in a DRAM capacity module is described with reference to FIGS. 1A–1B. Referring to FIG. 1A, an exemplary semiconductor wafer fragment 10, shown in a preliminary processing step, comprises a base layer 12, an insulative layer 14 of BPGS formed over base layer 12, an HSG polysilicon layer 16 overlying the BPSG insulative layer 14, and an opening 18. As shown in FIG. 1B, the HSG polysilicon layer 16 is incorporated into a capacitor construction 20 in which a silicon nitride-comprising dielectric layer 22 comprising a TCS nitride layer 24 and a capacitor plate layer 26, are formed over the HSG polysilicon layer 16. In a conventional process, the TCS nitride layer 24 can be deposited over both the BPSG layer 14 and the HSG polysilicon layer 16 by LPCVD by reacting silicon tetrachloride (SiCl$_4$) and ammonia (NH$_3$) over the substrate in a hot-wall reactor at about 500 to about 800° C. and a pressure of about 100 mTorr to about 2 Torr.

As depicted in FIG. 1B, transmission electron microscopy (TEM) cross-sectional images have shown that portion "A" of the TCS nitride layer 24 deposited on the surface of the BPSG substrate 14 to be comparatively thinner (about to about 20 angstroms) than the thickness of portion "B" of the TCS nitride layer 24 deposited on the HSG polysilicon substrate 18 (about 45 to about 50 angstroms).

At a thickness of less than about 20 angstroms, the nitride is not able to prevent the polysilicon electrode from becoming oxidated in the wet re-oxidation step that follows the cell nitride deposition. Consequently, re-oxidation results in the oxidation of the bottom polysilicon electrode. The volume expansion from the polysilicon oxidation will force the BPSG container sidewall to "bulge out" of the wafer surface. These bulges appear as "bubbling" from a top view in a Scanning Electron Microscopy (SEM) image. This is commonly referred to as "BPSG bubbling" and the nitride is said to be "punched through". These bubblings are fatal physical defects and will result in massive fail of the part. Beside preventing the BPSG bubbling problem, a desirable thickness of nitride on the BPSG also functions as a H$_2$ barrier in the subsequent wet re-oxidation and other processes to protect the active area in the device because H$_2$ could enhance boron diffusion and deactivate the transistor. The poor nucleation of TCS nitride on BPSG has limited the use of TCS nitride to below about 50 angstroms in current DRAM capacity modules.

Therefore, it is desirable to develop an improved process of forming dielectric silicon nitride films with TCS that will overcome the shortcomings of present TCS nitride processes. It is also desirable to provide an improved process to enable the production of a silicon nitride layer using TCS that will be of adequate thickness over substantially all silicon substrates of a device to provide the desired capacitor dielectric properties in a capacitor construction, and improve the characteristics of the fabricated semiconductors devices.

SUMMARY OF THE INVENTION

The present invention provides an improved method for forming silicon nitride films on semiconductor devices.

The present invention combines depositing a DCS nitride seeding layer with depositing a TCS nitride layer on a silicon-comprising substrate to improve the thickness of a dielectric silicon nitride layer deposited using TCS on silicon-comprising substrates of a semiconductor device being constructed. Before the deposition of the TCS nitride, a thin layer of DCS nitride is deposited as an interface "seeding layer" on the surface of the silicon-comprising substrate for the formation of the TCS nitride layer such as by low pressure chemical vapor deposition (LPCVD). Advantageously, the DCS seeding layer can be deposited without a conventionally used NH$_3$ pre-anneal nitridation step, by utilizing a pressure of about 1–3 Torr in the reaction chamber.

In one embodiment of the method of the invention, a silicon nitride layer is formed on a surface of a silicon-comprising substrate by first depositing a DCS nitride seeding layer on the surface to a thickness of up to about 5 angstroms, and then depositing a TCS silicon nitride layer on the DSC silicon nitride layer to a desired thickness for the application.

In another embodiment, the invention provides a method of forming a silicon nitride layer on a surface of a silicon-comprising substrate by first nitridizing the surface by exposure to a nitrogen-comprising gas of at least one of N$_2$, NH$_3$ or NO$_x$, preferably NH$_3$, to form at least a monolayer of silicon nitride to a thickness of less than about 5 angstroms. A DCS silicon nitride seeding layer is then deposited on the nitridated surface to a thickness of up to about 5 angstroms, and a TCS silicon nitride layer is then deposited on the DSC silicon nitride seeding layer to a desired thickness, typically about 40–50 angstroms or less.

In another method of the present invention, a silicon nitride layer is formed on a surface of a silicon-comprising substrate that includes two or more discrete areas comprised of different silicon-comprising materials, for example, TEOS, BPSG, polysilicon, HSG polysilicon, among others. A silicon nitride layer is formed on the surface of the various silicon-comprising substrates by depositing a thin DCS silicon nitride seeding layer on the surface to a thickness of up to about 5 angstroms, and then depositing a TCS silicon nitride layer on the DSC silicon nitride layer to a desired thickness. The cross-wafer thickness of the TCS silicon nitride layer is substantially equivalent over the entire substrate surface, regardless of the silicon-comprising substrate.

In yet another method of the invention, the surface of two or more discrete areas of different silicon-comprising substrates is nitridized to form at least a monolayer of silicon nitride thereon, and a silicon nitride layer is deposited on the surface of the nitridated layer. The silicon nitride layer is formed by depositing a DCS silicon nitride seeding layer on the nitridated layer, and then depositing a TCS silicon nitride layer on the DSC silicon nitride layer. The cross-wafer thickness of the resulting silicon nitride layer is substantially equivalent from area to area over the surface of the substrate.

In another aspect, the invention encompasses a method of forming a capacitor. The method includes forming a first capacitor plate comprising a silicon-comprising substrate, for example, HSG polysilicon, forming a dielectric layer of silicon nitride proximate the first capacitor plate, and forming a second capacitor plate over the silicon nitride layer. The silicon nitride layer is formed by first depositing a thin DCS silicon nitride seeding layer of up to about 5 angstroms on the surface of the first capacitor plate, and then depositing a TCS silicon nitride layer on the DSC silicon nitride seeding layer, to a desired thickness, for example, about 40–50 angstroms. Preferably, the DCS and TCS silicon nitride layers are deposited by chemical vapor deposition, preferably by LPCVD.

In another method of forming a capacitor according to the invention, a capacitor is prepared by forming a first capacitor plate comprising a silicon-comprising substrate surface such as HSG polysilicon, a silicon nitride dielectric layer proximate the first capacitor plate, and a second capacitor plate over the dielectric layer. The silicon-based substrate surface of the first capacitor plate is nitridized in a nitrogen-comprising ambient, preferably NH$_3$, to form from one to three monolayers of silicon nitride on the substrate surface, preferably up to about 2 angstroms. A thin DCS silicon nitride seeding layer of about to about 5 angstroms is then deposited on the nitridated silicon-based surface, and a TCS nitride layer is deposited on the DSC nitride layer to the desired thickness.

In another aspect, the invention provides a capacitor. The capacitor includes a first capacitor plate comprising a silicon-comprising substrate, a second capacitor plate, and a dielectric silicon nitride layer intermediate the first and second capacitor plates. In a first embodiment of a capacitor according to the invention, the silicon nitride layer is composed of a thin DCS silicon nitride seeding layer up to about 5 angstroms deposited on the first capacitor plate, and a TCS silicon nitride layer deposited on the DSC silicon nitride layer to a desired thickness.

In another embodiment, the capacitor includes a silicon nitride layer intermediate first and second capacitor plates, the silicon nitride layer composed of a nitridized layer of silicon nitride on the surface of the first capacitor plate, preferably up to about 2 angstroms thick or from three to less than one monolayers of silicon nitride, a thin DCS nitride seeding layer of up to about 5 angstroms deposited on the nitridated layer, and a TCS nitride layer deposited on the DSC silicon nitride layer to a desired thickness.

Semiconductor devices fabricated with the silicon nitride deposition method according to the present invention to provide a DCS/TCS nitride layer, have substantially the same electrical performance as a conventional device fabricated with a silicon nitride layer made of TCS nitride alone, and improved Cp-leakage performance over a device made with a DCS nitride layer alone. Also, with the use of the DCS seeding layer, the nucleation and deposition rate of the TCS nitride component upon the substrate is substantially equivalent regardless of the silicon-comprising material that constitutes the substrate. This alleviates the problem of different or degraded electrical characteristics that result from the differences in the nitride thickness deposited on adjacent surfaces. Such differences are especially apparent, for example, between a conductor composed of silicon, and an insulator composed of TEOS, where a relatively thin nitride layer deposited at a silicon/TEOS edge can result in degraded electrical properties at that edge and for the resulting fabricated device.

The use of the DCS/TCS nitride layer also resolves the fatal BPSG bubbling problem that occurs with TCS nitride layers that are deposited directly on BPSG substrates in semiconductor devices. Additionally, the elimination of a high temperature $NH_3$ pre-anneal step from the process conserves the thermal budget for other processes in the fabrication operation.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 4a–4f are top views of SEM (scanning electron microscopy) images taken at the center of a wafer after top cell polysilicon deposition on BPSG.

FIG. 4a: standard TCS deposition on BPSG (TEL baseline TCS process with nitride measured thickness of 51 Å shows severe "bubbling" of the BPSG).

FIG. 4b: two-minute DCS seeding deposition preceding a TCS deposition (with nitride measured thickness of 51 Å does not show "bubbling" of BPSG.

FIG. 4c: five-minute DCS seeding deposition before TCS deposition (with nitride measured thickness of 48 Å does not show "bubbling" of BPSG.

FIG. 4d: standard DCS nitride deposition (ASM DCS nitride with thickness of 56 Å does not show "bubbling"of BPSG.

FIG. 4e: twenty-minute $NH_3$ pre-anneal before TCS deposition (with nitride measured thickness of 52 Å shows slight "bubbling" of the BPSG.

FIG. 4f: twenty-minute $NH_3$ pre-anneal before TCS deposition (with nitride measured thickness of 47 Å shows "bubbling" of the BPSG.

DETAILED DESCRIPTION OF THE PREFERRED EMBODIMENTS

The present invention encompasses methods of forming silicon nitride dielectric layers, methods of incorporating such dielectric layers into capacitor constructions, and capacitors formed from such methods.

The surface of a semiconductor device being fabricated can include one or more of any one of the different types of surfaces as described above, including but not limited to wafer surfaces such as tetraethylorthosilicate (TEOS), borophosphosilicate glass (BPSG), silicon, polysilicon, HSG polysilicon, other doped silicon or polysilicon surfaces, other doped oxides, thermal silicon dioxide, chemical vapor deposited (CVD) silicon dioxide, plasma enhanced CVD (PECVD) silicon dioxide, or any other film or surface upon which silicon nitride would be deposited in the fabrication of semiconductor devices. The method of the present invention can be utilized with regard to any of the foregoing substrates to deposit a suitable TCS nitride layer thereon.

Figure 1A:
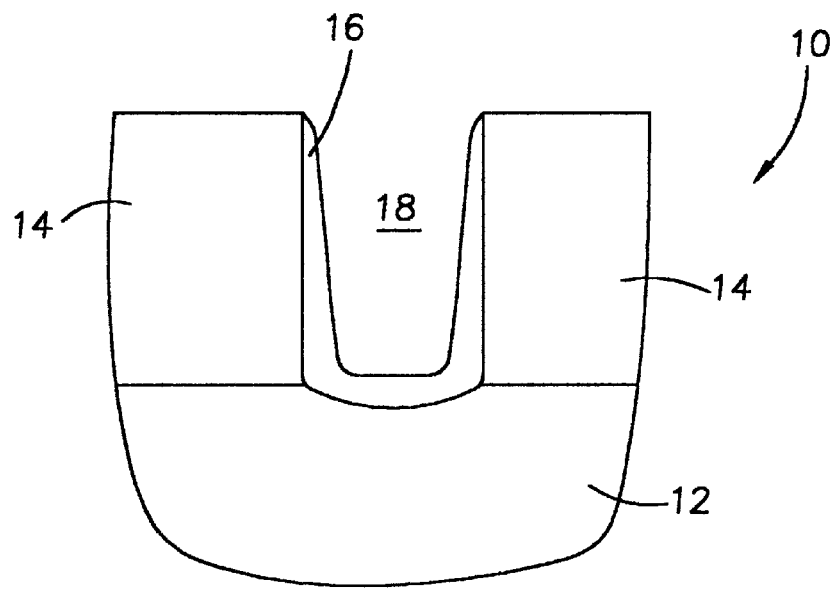
FIG. 1A is a diagrammatic cross-sectional view of a semiconductor wafer fragment at a preliminary step of a prior art processing sequence.
Figure 1B:
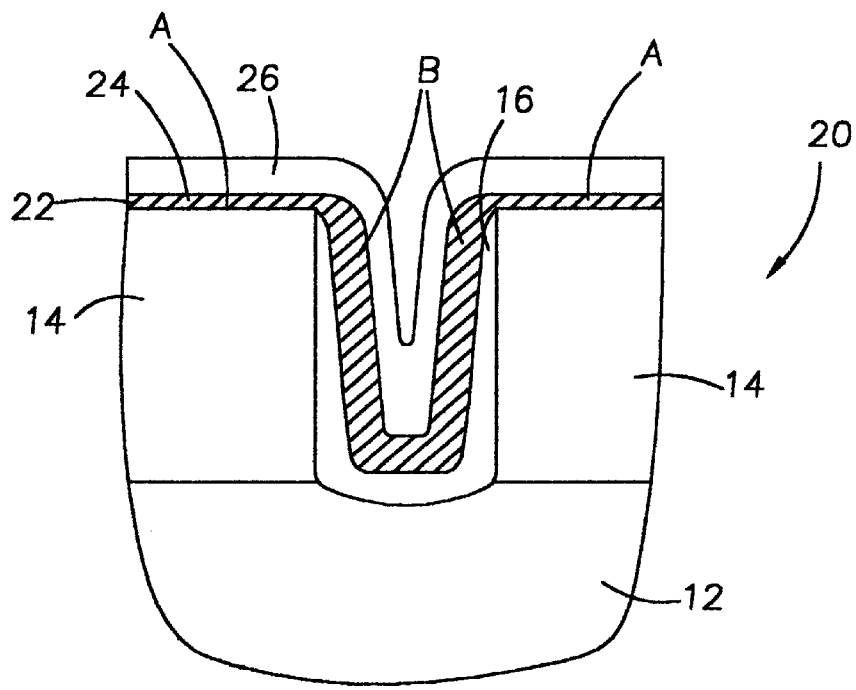
FIG. 1B is a view of the wafer fragment of FIG. 1A at a step subsequent to FIG. 1A to form a capacitor.
Figure 2A:
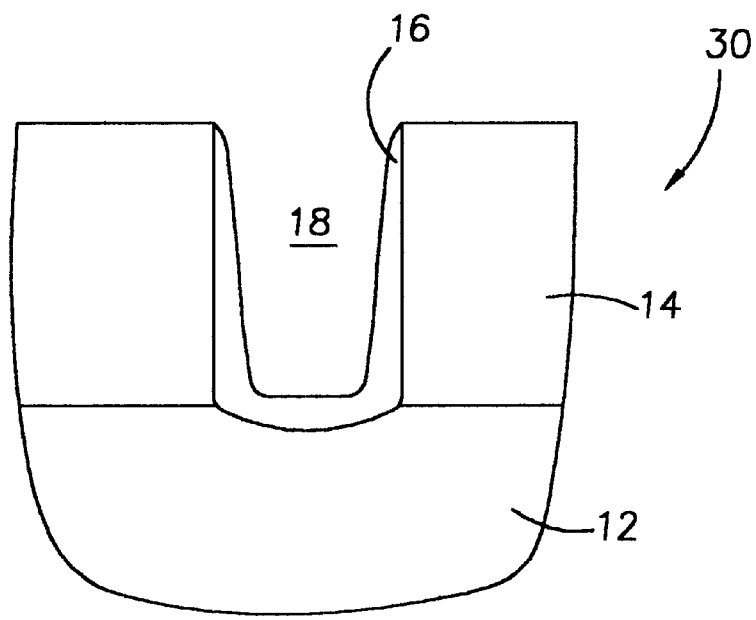
FIG. 2A is a diagrammatic cross-sectional view of a semiconductor wafer fragment at a preliminary step of a processing sequence to form a capacitor according to a first embodiment of the method of the present invention.

A first embodiment of a method of the present invention is described with reference to FIGS. 2A–2D, in a method of forming a capacitor. Referring to FIG. 2A, a semiconductor wafer fragment 30 is shown at a preliminary processing step of the method of the invention, and is identical to prior art wafer fragment 10. Wafer fragment 30 comprises a base layer 12, an insulative layer 14 deposited onto the base layer 12, a silicon layer 16 overlying the insulative layer 14, and an opening 18.

An exemplary base layer 12 is, for example, a monocrystalline silicon wafer lightly doped with a background p-type dopant. An exemplary material for the insulative layer 14 is BPSG, and for the silicon layer 16 is HSG polysilicon, which can be formed, for example, by converting an amorphous silicon layer deposited by on the insulative layer by conventional methods such as chemical vapor deposition, and converted to an HSG layer by seeding and annealing procedure, such as described in U.S. Pat. Nos. 5,634,974 and 5,691,288, the disclosures of which are incorporated herein by reference.

Referring to FIGS. 2A–2D, the HSG polysilicon layer 16 is incorporated into a capacitor construction 40, as a first capacitor plate layer. The silicon nitride-comprising dielectric layer 22 is formed over the BPSG insulative layer 14 and the HSG polysilicon layer 16, and then a capacitor plate layer 26, for example, a CVD conductively doped polysilicon, is formed over the silicon nitride-comprising dielectric layer 22.

Figure 2B:
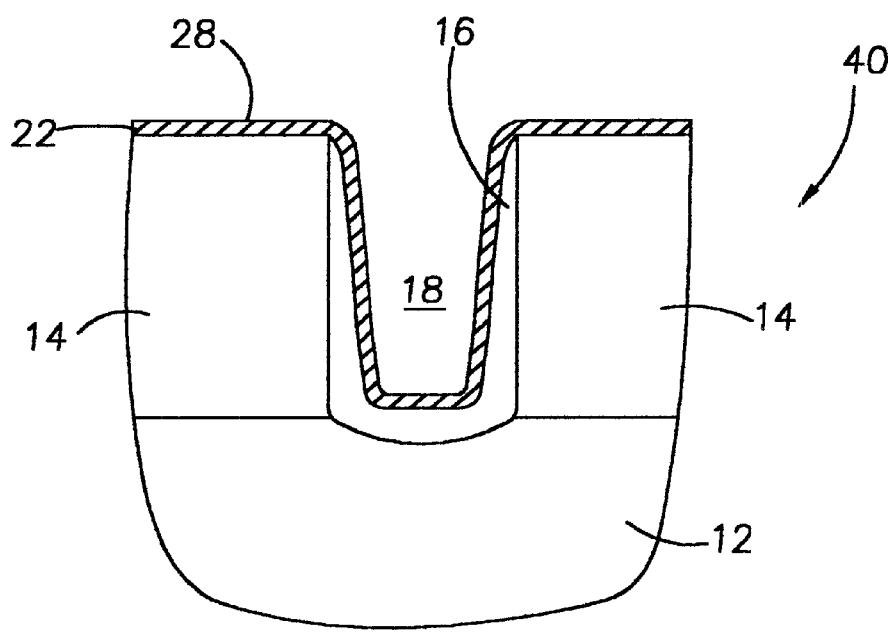
FIGS. 2B–2D are views of the wafer fragment of FIG. 2A at subsequent and sequential processing steps.

In forming the capacitor 40, it is important to achieve a silicon nitride-comprising dielectric layer 22 having a substantially equivalent thickness over both surface types, as previously described. To achieve this according to a first embodiment of the method of the invention, a DCS nitride seeding layer 28 is deposited on to the surfaces of the BPSG insulative layer 14 and the HSG polysilicon layer 16 prior to depositing the TCS nitride layer 24, as shown in FIG. 2B.

Although not shown, as a preliminary step prior to depositing the silicon nitride layer 22, it is preferred to remove any oxide that may be formed on the surface of the wafer from exposure to oxygen. Native oxide that is formed on the wafer surface can be removed, for example, with an in situ oxide wet clean utilizing HF, such as by immersion in an HF solution, or by HF vapor treatment, with or without agitation or scrubbing, according to methods known to persons of ordinary skill in the art. The HF-cleaned surface is then rinsed in deionized water and dried. Other pretreatment or cleaning processes may include the use of $NH_4F$ solution, NH$_4$F/HF solution or buffered oxide etch (BOE), or any other cleaning solution known to one skilled in the art to provide a hydrophobic oxide free surface.

A conventional low pressure chemical vapor deposition (LPCVD) process can be used for depositing the thin DCS silicon nitride seeding layer 28 on the wafer surface. An exemplary DCS silicon nitride deposition by an LPCVD process can include reacting dichlorosilane (SiH$_2$Cl$_2$) and ammonia (NH$_3$) at a temperature of about 600° C. to about 800° C., a pressure in the range of about 1500 mTorr to about 500 mTorr, with a NH$_3$:SiH$_{2Cl2}$ ratio of about 3:1 to about 10:1, to deposit a thin layer 28 of DCS silicon nitride having a thickness of up to about 5 angstroms, preferably about 3 to about 8 angstroms. The seeding layer can also be made, for example, by SiH$_4$/NH$_3$ and Si$_2$H$_6$/NH$_3$ systems, which are known to have good nucleation on oxide.

A preferred method for deposition of the DCS silicon nitride seeding layer 28 is by LPCVD using dichlorosilane and ammonia. The preferred conditions for LPCVD include a temperature in the range of about 600° C. to about 800° C., a pressure in the range of about 50 mTorr to about 1500 mTorr, and an NH$_3$:DCS ratio in the range of about 3:1 to about 10:1, preferably about 4:1 to about 6:1, to deposit a layer of about 3 angstroms to about 8 angstroms.

Figure 2C:
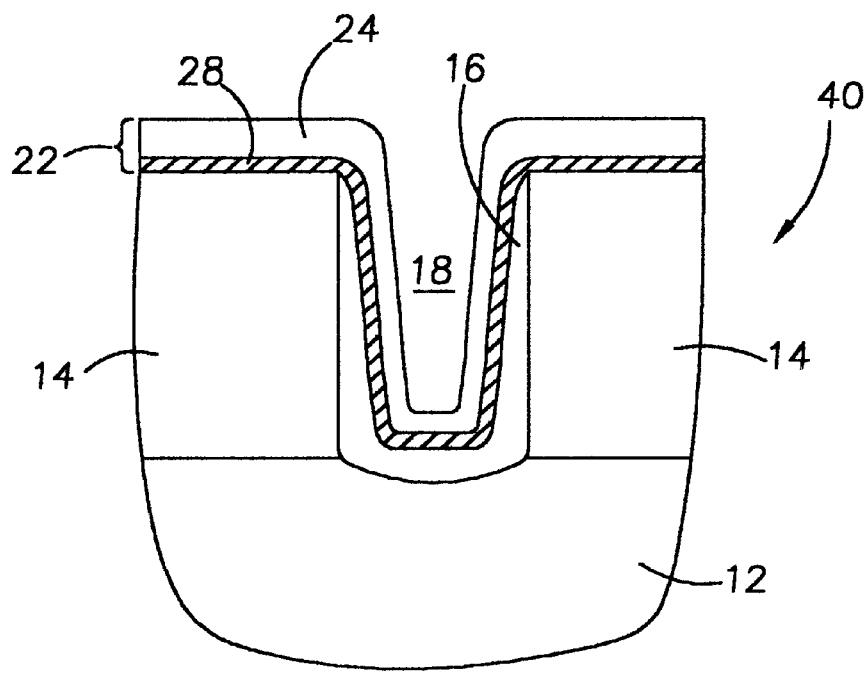
Figure 2D:
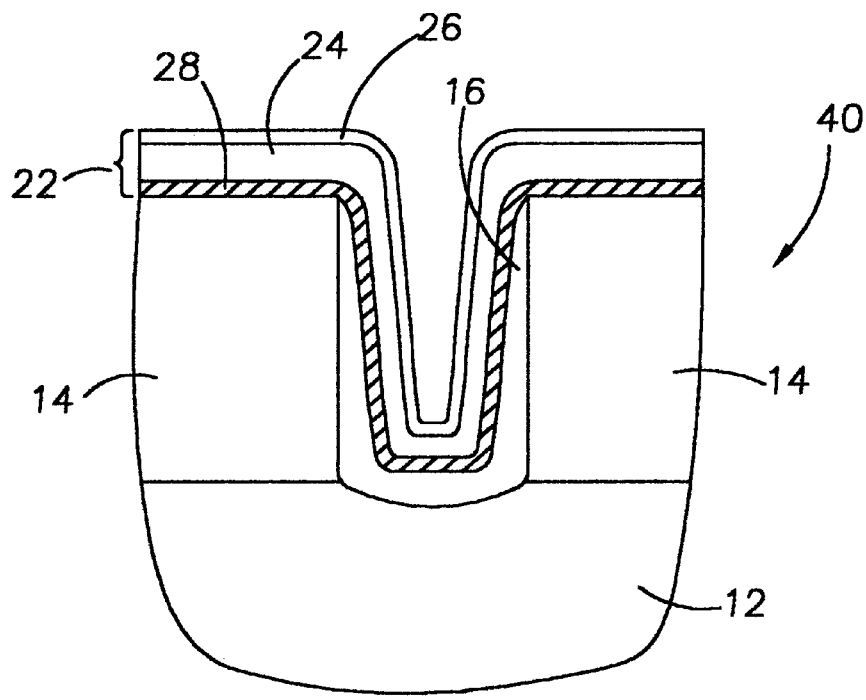

Referring to FIG. 2C, a TCS nitride layer 24 is then deposited on the thin DCS seeding layer 28 to a desired thickness. A conventional low pressure chemical vapor deposition (LPCVD) process can likewise be used for depositing the TCS nitride layer 24. The TCS nitride deposition process can be performed, for example, by the reaction of silicon tetrachloride (SiCl$_4$) and ammonia (NH$_3$) at a temperature of about 500° C. to about 800° C., a pressure in the range of about 50 mTorr to about 1500 mTorr, with a NH3:SiCl$_4$ ratio of about 2:1 to about 1:2 to deposit a TCS silicon nitride layer to a thickness of up to about 50 angstroms, preferably about 45 to about 55 angstroms.

A preferred method for deposition of the TCS silicon nitride layer 24 is by LPCVD using silicon tetrachloride and ammonia. The preferred conditions for LPCVD include a temperature in the range of about 500° C. to about 800° C., a pressure in the range of about 50 mTorr to about 1500 mTorr, and an NH$_3$:TCS ratio in the range of about 10:1 to about 1:2, preferably about 2:1 to about 1:2, to deposit a layer of about 3 angstroms to about 8 angstroms.

The method of the invention results in a silicon nitride layer having a resultant thickness of up to about 50 angstroms and reduced leakage current characteristics. Preferably, the total thickness of the dielectric silicon nitride-comprising layer 22 is about 40 to about 60 angstroms, preferably about 45 to about 55 angstroms.

Although LPCVD and the stated conditions are preferred, it is understood that conventional silicon nitride deposition processes other than LPCVD, can also be used to deposit suitable DCS and TCS silicon nitride layers. For example, such processes can include physical deposition processes, plasma enhanced chemical vapor deposition processes, and rapid thermal chemical vapor deposition processes, among others.

Systems for wafer pretreatment and silicon nitride deposition are well known to those skilled in the art, as described, for example, is U.S. Pat. No. 5,939,333, the disclosure of which is incorporated herein by reference. In an exemplary system for the silicon nitride formation process shown in FIGS. 3A–3E, the wafer surfaces may be pretreated in situ with respect to the silicon nitride formation step with an HF clean, such as an HF vapor clean in an HF vapor module (not shown). With such a system, the wafers are transferred from the pretreatment unit by a wafer transfer module to an LPCVD module (not shown) for the DCS and TCS silicon nitride deposition, without exposure to air to prevent native oxide formation. The wafers are then be positioned and sealed in the deposition chamber, whereupon heating elements bring the temperature of the chamber to about 640° C. to 800° C. Utilizing a pump, the system is then pumped down to a pressure of about 10 mTorr or less after which the deposition chamber is purged using N$_2$ or other inert gas. The system is then pumped down to a pressure of about 10 mTorr or less after which an NH$_3$ prepurge is performed during which the pressure is in the range of about 50 mTorr to about 700 mTorr. The DCS nitride deposition is then performed in accordance with conventional LPCVD processes according to the method and conditions described herein. Following the deposition of the DCS nitride layer, the deposition chamber is purged with NH$_3$ during which the pressure is in the range of about 50 mTorr to about 700 mTorr.

For the TCS nitride deposition, the system is then pumped down to a pressure of about 10 mTorr or less, the deposition chamber is purged with N$_2$ or other inert gas, and the system is pumped down again to a pressure of about 10 mTorr or less. An NH$_3$ prepurge is then performed during which the pressure is in the range of about 50 mTorr to about 700 mTorr. The TCS nitride deposition is performed in accordance with the conventional LPCVD process according to the method and conditions described herein. Following the deposition of the TCS nitride layer, the deposition chamber is purged with NH$_3$ during which the pressure is in the range of about 50 mTorr to about 700 mTorr, and then the system is pumped down to a pressure of about 10 mTorr or less. The deposition chamber is then vented to atmosphere using N$_2$ or other inert gas.

Figure 3A:
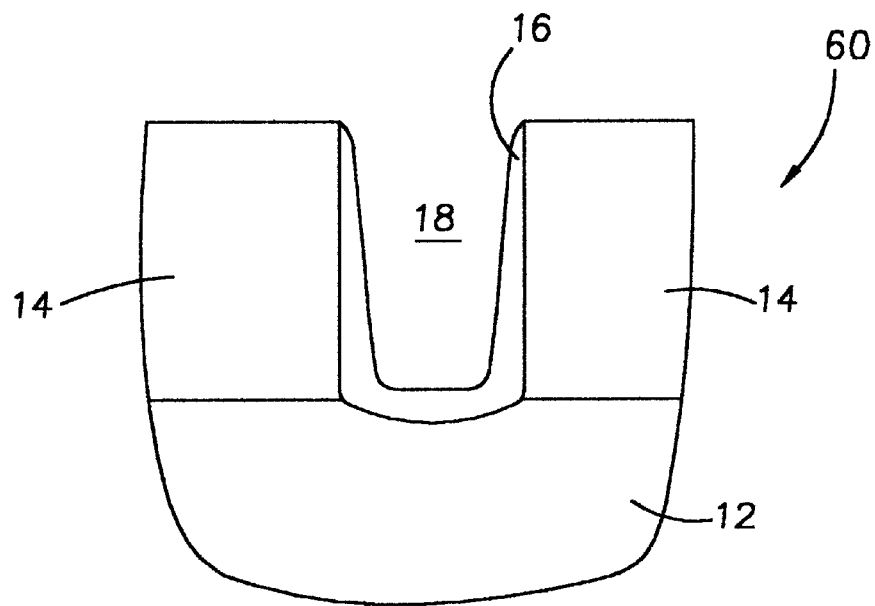
FIG. 3A is a diagrammatic cross-sectional view of a semiconductor wafer fragment at a preliminary step of a processing sequence to form a capacitor according to a second embodiment of the method of the present invention.
Figure 3B:
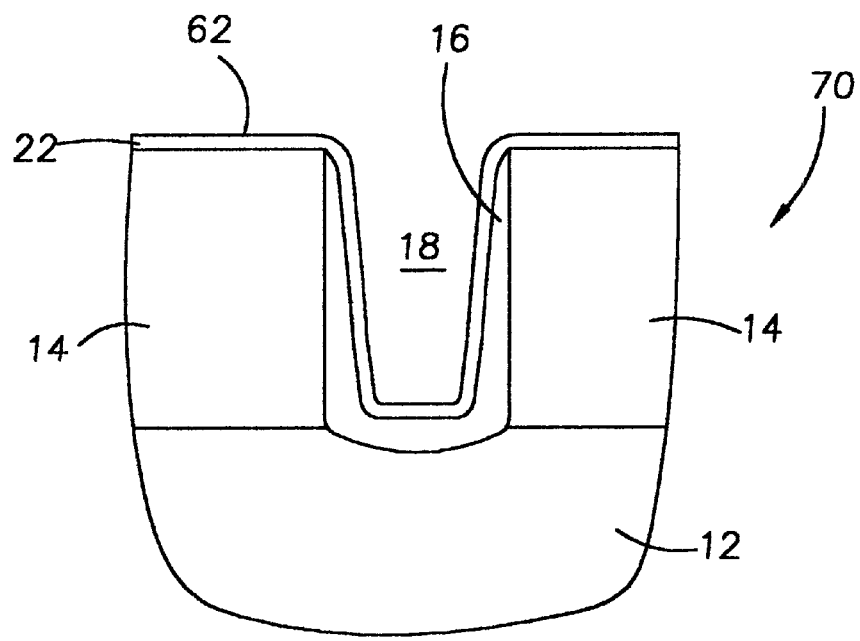
FIGS. 3B–3E are views of the wafer fragment of FIG. 3A at subsequent and sequential processing steps.
Figure 3C:
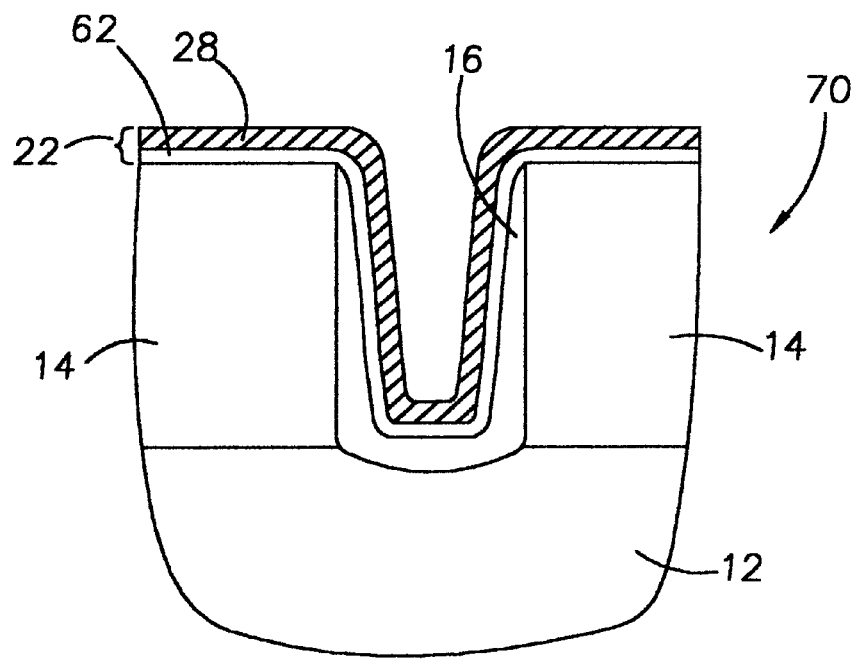
Figure 3D:
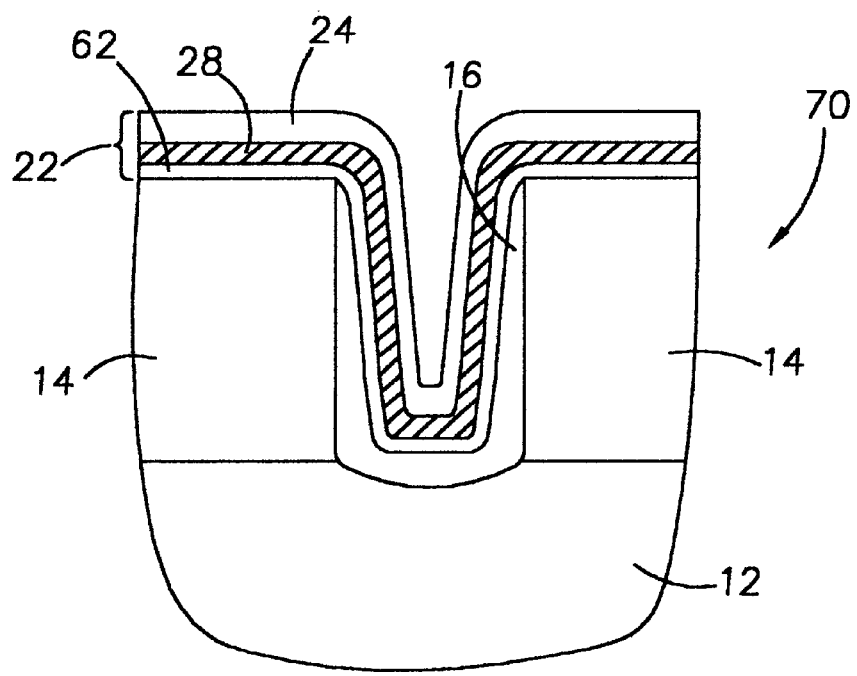
Figure 3E:
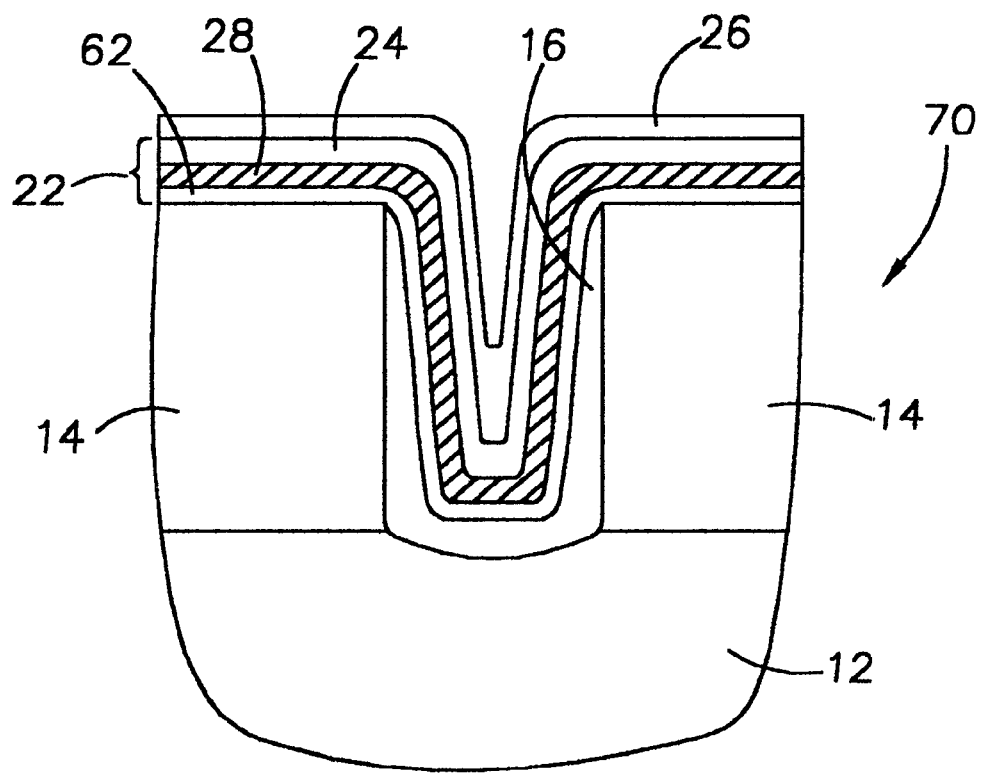

Referring now to FIGS. 3A–3E, a second embodiment of the method of the invention is described in a method of forming a capacitor 70. Referring to FIG. 3A, a semiconductor wafer fragment 60, identical to prior art wafer fragment 10 and wafer fragment 30, comprises a base layer 12, an insulative layer 14 deposited on a surface of the base layer 12, a silicon layer 16 overlying the insulative layer 14, and an opening 18. In an exemplary wafer fragment 60, the insulative layer 14 is BPSG, and the silicon layer 16 is HSG polysilicon. The HSG polysilicon layer 16 is incorporated into a capacitor construction 70, as a first capacitor plate layer. A silicon nitride-comprising dielectric layer 22 is formed intermediate the HSG polysilicon layer 16 and a second capacitor plate layer 26 (FIG. 3E).

According to the method, the surfaces of the BPSG layer 14 and the HSG polysilicon layer 16 are nitridized prior to the deposition of the DCS nitride seeding layer 28 and the TCS nitride layer 24. The nitridation of the BPSG layer 14 and the HSG polysilicon layers 16, increases the number of nucleation sites and nucleation rate for the subsequently deposited DCS nitride seeding layer 28.

The deposition of the silicon nitride-comprising layer using the nitridation step in accordance with the second embodiment of the invention is performed in substantially the same manner as described with respect to FIGS. 2A–2D with the addition of the nitridation step as shown in FIG. 3B. Therefore, the following description with reference to FIGS. 3A–3E will be limited to the nitridation step.

Referring to FIG. 3B, a thin silicon nitride layer 22 is formed over the BPSG layer 14 and the HSG polysilicon layers 16 by conventional nitridation methods typically used for forming a layer of silicon nitride on an oxide-free wafer surface.

Such conventional methods typically include growing a silicon nitride film on a silicon-comprising surface by exposing the surface to a nitrogen-comprising ambient.

The nitrogen-comprising atmosphere may comprise $N_2$, $NH_3$ or $NO_x$, alone or in mixtures of two or more. Further, the nitrogen-comprising atmosphere may consist essentially of a gas selected from the group consisting of $N_2$, $NH_3$ or $NO_x$, and mixtures thereof. An exemplary nitridizing process comprises rapid thermal nitridation (RTN) of a silicon layer in a nitrogen-comprising atmosphere at a temperature of about 900° C. to about 1300° C., and a pressure of about 100 Torr to about 760 Torr.

Preferably, the BPSG layer 14 and the HSG polysilicon layers 16 are exposed to an atmosphere comprising ammonia ($NH_3$), at a temperature of about 500° C. to about 750° C. and a pressure of about 50 Torr to about 200 Torr to form a silicon nitride-comprising layer 22 to a thickness of less than three monolayers of silicon nitride, preferably one monolayer of silicon nitride, or up to about 2 angstroms, preferably up to about 5 angstroms.

Systems for nitridation of a silicon-comprising surface are well known in the art. In an exemplary system for nitridation of the wafer surface, the surfaces may be pretreated as discussed herein, for example, with an HF clean, and transferred to a conventional LPCVD module. The temperature of the chamber is brought up to about 400° C. to about 600° C. After pumping down the system to a pressure of about 1 mTorr to about 10 mTorr., the nitridation process is performed in an atmosphere of at least one of $N_2$, $NH_3$ or $NO_x$.

Below about 500° C., the surface coverage is typically a monolayer of silicon nitride, independent of temperature, although the time required to achieve the monolayer increases as temperature decreases. At about 550° C. to about 600° C., the surface typically exceeds a monolayer, and at about 600° C., the surface coverage may approach a double layer of silicon nitride. Suitable nitridation of the silicon based surfaces results in less than three monolayers of silicon nitride formation and preferably one monolayer or less.

After the nitridation of the BPSG layer 14 and the HSG polysilicon layers 16, the system is then pumped down to a pressure of about 10 mTorr or less, followed by an $NH_3$ prepurge during which the pressure is in the range of about 50 mTorr to about 700 mTorr. The prepurge is then followed by the remainder of the steps to deposit the DCS nitride seeding layer 28 and the TCS nitride layer 24, as illustrated in FIGS. 3C–3D, and described with reference to FIGS. 2B–2C, to complete the silicon nitride deposition process.

Deposition of the DCS nitride seeding layer 28 preferably provides a thin layer of less than about 5 angstroms, preferably about 3–8 angstroms. The cross-wafer thickness of the TCS nitride layer 24 is substantially equivalent over the different wafer surfaces, i.e., the BPSG portion 14 and the HSG polysilicon portion 16, which results in improved electrical characteristics and mechanical properties for the semiconductor device being fabricated. Typically, the thickness of the TCS nitride layer can range from about 40 to about 60 angstroms.

The present invention is beneficial for all thin dielectric applications applications utilizing silicon nitride films. Such applications include, for example, the dielectrics for memory cells and gate dielectrics, among others. As such, the foregoing configurations are purely for illustration only and are not to be taken as limiting to the present invention as defined by the accompanying claims.

EXAMPLE

DCS nitride and TCS nitride were deposited, alone and in combination, on a BPSG substrate to compare the measured thicknesses of the nitride layer and Cp-leakage performance.

There was a 10-minute $NH_3$ pre-anneal before the DCS seeding layer deposition. The time period of the $NH_3$ pre-anneal included a ramp-up time from 300° C. to 800° C. The DCS and TCS nitride depositions were at about 640° C. with pressure of 0.15 Torr and 0.2 Torr, respectively. After the cell nitride deposition, all wafers went through a standard wet re-oxidation (750° C., 105 Å target on Si blank test wafer).

The experimental details and results are shown below in Table 1 and depicted in FIGS. 4A–4F and FIG. 5. The results show that the deposition of a silicon nitride layer utilizing a DCS nitride seeding layer for TCS nitride offers the same electrical performance as a TCS nitride layer, and solves the "bubbling" problem of deposition of TCS nitride on BPSG in DRAM devices.

TABLE 1

| Group No. | Experimental nitride deposition on BPSG | FIG. | Nitride layer Thickness (Å) | Amount of bubbling of BPSG |
| --- | --- | --- | --- | --- |
| 1 | Standard TCS nitride | 4a | 51 | Severe |
| 2 | 2 minute DCS seeding before the TCS deposition (29.6 mins.) | 4b | 51 | None |
| 3 | 5 minute DCS seeding before the TCS deposition (25.6 mins.) | 4c | 48 | None |
| 4 | 5 minute DCS seeding before the TCS deposition (29.6 mins.) |  | 52 | None |
| 5 | 5 minute DCS seeding before the TCS deposition (33.6 mins.) |  | 55 | None |
| 6 | DCS standard cell nitride | 4d | 56 | None |
| 7 | 20 minute $NH_3$ pre-anneal before the TCS deposition | 4e | 52 | Slight |
| 8 | 20 minute $NH_3$ pre-anneal before the TCS deposition | 4f | 47 | Slight |

FIG. 4a depicts a standard TCS deposition resulting in a nitride thickness of 51 Å the edge of the wafer and severe "bubbling" of the BPSG at the center of a wafer.

In order overcome such shortcomings of a TCS nitride layer on BPSG, a deposition process was performed by combining the DCS nitride with the TCS nitride. In one run, before the deposition of TCS nitride, a very thin DCS nitride was deposited as an interface seeding layer. This process produced a TCS+DCS nitride layer having a thickness of 51 Å and 48 Å across the whole surface of the wafer "bubbling" of the BPSG (FIGS. 4b and 4c).

FIG. 4d depicts a DCS standard nitride layer that is 56 Å thick with no bubbling of the BPSG.

FIGS. 4e and 4f illustrate "bubbling" of the BPSG with nitride layers 52 Å and 47 Å thick that were formed with a 20-minute $NH_3$ pre-anneal before the TCS nitride deposition. These results show that the use of a DCS nitride seeding layer was more effective than increasing the $NH_3$ pre-anneal time.

The results also showed that Cp-leakage performance of a TCS nitride layer that included a DCS seeding layer was much better than a DCS nitride layer alone and comparable to a TCS nitride layer alone. This indicated that DCS nitride seeding layer functioned as an interface layer to improve the surface condition for TCS nitride on BPSG without substantially decreasing the superior electrical properties of the overall nitride film.

Figure 5:
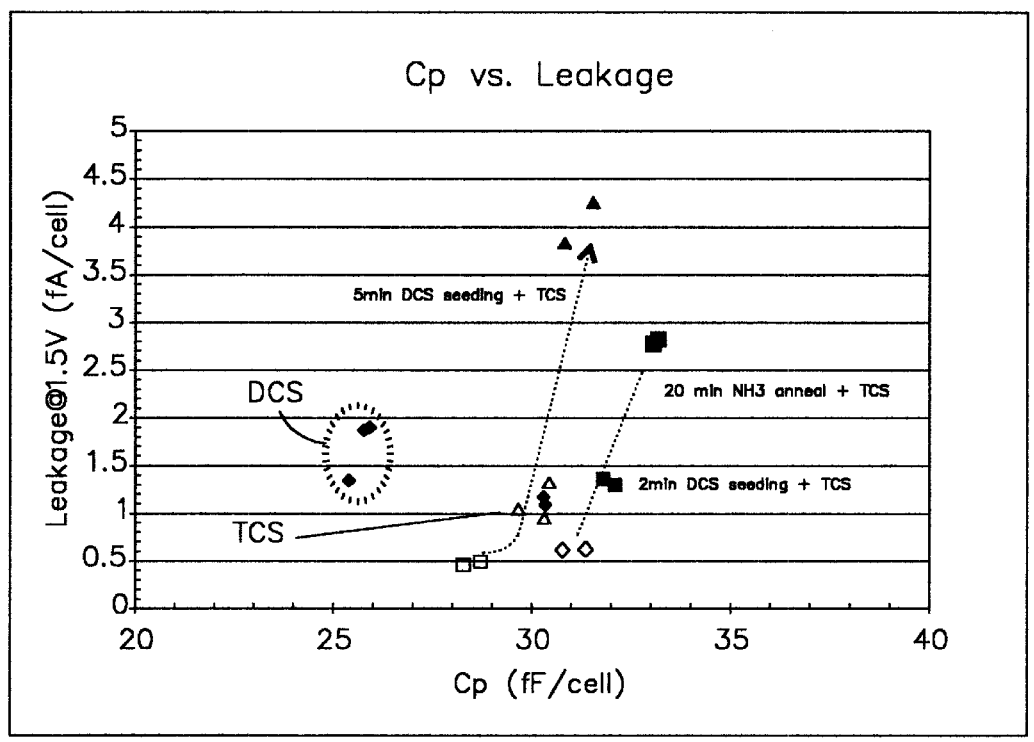
FIG. 5 is a graphical depiction of capacitance (Cp) versus leakage performance of the deposited structures of FIGS. 4a–4f.

FIG. 5 is a graphical comparison of Cp-leakage for the TCS nitride layer combined with a DCS seeding layer and deposited on BPSG, and for the standard DCS nitride layer and standard TCS nitride layer, in TEL fast ramp furnace for a 9I short loop lot. The process details of each group is listed in Table 1, above. The data in FIG. 5 shows that all TCS nitride test groups were better than the DCS standard nitride, and the TCS nitrides with DCS seeding layer were comparable to the pure TCS nitride film.

In compliance with the statute, the invention has been described in language more or less specific as to structural and methodical features. It is to be understood, however, that the invention is not limited to the specific features shown and described, since the means herein disclosed comprise preferred forms of putting the invention into effect. Although the invention has been described with particular reference to preferred embodiments thereof, variations and modifications of the present invention can be made within a contemplated scope of the following claims as is readily known to one skilled in the art. The invention is, therefore, claimed in any of its forms or modifications within the proper scope of the appended claims appropriately interpreted in accordance with the doctrine of equivalents.

What is claimed is:

1. A method of forming a silicon nitride layer on a silicon-comprising substrate, comprising the steps of:

exposing a surface of the substrate to a gas mixture of dichlorosilane and a nitrogen-comprising gas to deposit a first layer of silicon nitride on the surface of the substrate, the first layer having an exposed surface; and exposing the exposed surface of the first layer to a gas mixture of silicon tetrachloride and a nitrogen-comprising gas to deposit a second layer of silicon nitride of a desired thickness on the exposed surface of the first layer.

2. The method of claim 1, wherein the first silicon nitride layer has a thickness of up to about 5 angstroms.

3. The method of claim 1, wherein the second silicon nitride layer has a thickness of about 40–50 angstroms.

4. The method of claim 1, wherein the nitrogen-comprising gas is $N_2$, $NH_3$ or $NO_x$, or a mixture thereof.

5. The method of claim 1, wherein the nitrogen-comprising gas is $NH_3$.

6. The method of claim 1, wherein the first silicon nitride layer is formed by low pressure chemical vapor deposition to a thickness of less than about 5 angstroms; and the second silicon nitride layer is formed by low pressure chemical vapor deposition to a thickness of up to about 50 angstroms.

7. A method of forming a silicon nitride layer on a silicon-comprising substrate, comprising the steps of:

exposing a surface of the substrate to a gas mixture of dichlorosilane and a nitrogen-comprising gas to deposit a first layer of silicon nitride on the surface of the substrate, the first silicon nitride layer having an exposed surface and a thickness of up to about 5 angstroms; and exposing the exposed surface of the first layer to a gas mixture of silicon tetrachloride and a nitrogen-comprising gas to deposit a second layer of silicon nitride having a thickness of about 40 to about 50 angstroms on the exposed surface of the first layer.

8. A method of forming a silicon nitride layer on a silicon-comprising substrate comprising at least two discrete areas of silicon-comprising materials having a different surface nucleation rate for silicon tetrachloride in a chemical vapor deposition to form a silicon nitride layer thereon, the method comprising the steps of:

exposing a surface of the substrate to a gas mixture of dichlorosilane and a nitrogen-comprising gas to deposit a first layer of silicon nitride on the surface of the substrate, the first layer having an exposed surface;

exposing the exposed surface of the first layer to a gas mixture of silicon tetrachloride and a nitrogen-comprising gas to deposit a second layer of silicon nitride of a desired thickness on the exposed surface of the first layer whereby the cross-substrate thickness of the second silicon nitride layer is substantially equivalent.

9. The method of claim 8, wherein a first area of the silicon-comprising substrate comprises an insulative material selected from the group consisting of tetraethylorthosilicate, borophosphosilicate glass, and silicon dioxide; and a second area of the silicon-comprising substrate comprises a silicon material selected from the group consisting of silicon, polysilicon, hemispherical grain polysilicon, a doped silicon, and a doped polysilicon.

10. A method of forming a silicon nitride-comprising layer, comprising the steps of:

forming a first silicon nitride layer over a surface of the substrate by chemical vapor deposition of dichlorosilane to a thickness of up to about 5 angstroms, the first layer having an exposed surface; and forming a second silicon nitride layer over the exposed surface of the first layer by chemical vapor deposition of silicon tetrachloride to a thickness of about 40 to about 50 angstroms;

the first and second layers together forming the silicon nitride-comprising layer.

11. A method of semiconductive wafer processing, comprising depositing a silicon nitride-comprising layer over a surface of a semiconductive wafer, the depositing comprising the steps of:

depositing a first portion of the silicon nitride-comprising layer of less than about 5 angstroms on the surface of the wafer, utilizing a mixture of dichlorosilane and a nitrogen-comprising gas, the first portion of the layer having an exposed surface; and depositing a second portion of the silicon nitride layer of up to about 50 angstroms on the exposed surface of the first portion of the layer, utilizing a mixture of silicon tetrachloride and a nitrogen-comprising gas.

12. A method of forming a silicon nitride layer on a silicon-comprising substrate, comprising the steps of:

nitridizing the surface of the substrate by exposing the substrate to a nitrogen-comprising gas to form a first layer of silicon nitride on the surface of the substrate, the first layer having an exposed surface;

exposing the exposed surface of the first layer to a gas mixture of dichlorosilane and a nitrogen-comprising gas to deposit a second layer of silicon nitride on the exposed surface of the first layer, the second layer having an exposed surface; and exposing the exposed surface of the second layer to a gas mixture of silicon tetrachloride and a nitrogen-comprising gas to deposit a third layer of silicon nitride of a desired thickness on the exposed surface of the second layer.

13. The method of claim 12, wherein the nitridizing comprises rapid thermal nitridation at a temperature of about 700–1000° C., and a pressure of about 100–760 mTorr to a thickness of up to about 5 angstroms.

14. A method of forming a silicon nitride layer on a silicon-comprising substrate, comprising the steps of:

nitridizing a surface of the substrate by exposing the surface to a nitrogen-comprising gas to form a first layer of silicon nitride on the surface of the substrate; the first silicon nitride layer having an exposed surface and a thickness of up to about 5 angstroms;

exposing the exposed surface of the first layer to a gas mixture of dichlorosilane and a nitrogen-comprising gas to deposit a second layer of silicon nitride on the exposed surface of the first layer, the second silicon nitride layer having an exposed surface and a thickness of up to about 5 angstroms; and exposing the exposed surface of the second layer to a gas mixture of silicon tetrachloride and a nitrogen-comprising gas to deposit a third layer of silicon nitride on the exposed surface of the second layer, the third silicon nitride layer having a thickness of up to at about 50 angstroms.

15. The method of claim 14, wherein the surface of the semiconductive wafer comprises at least two portions of silicon-comprising materials having different surface nucleation rates for silicon tetrachloride in a nitrogen-comprising gas to form a silicon nitride layer thereon; and the thickness of the third silicon nitride layer is substantially equivalent over each of the areas of the silicon-comprising substrate.

16. A method of forming a silicon nitride layer on a silicon-comprising substrate comprising at least two discrete areas of silicon-comprising materials having a different surface nucleation rate for silicon tetrachloride in a chemical vapor deposition to form a silicon nitride layer thereon, the method comprising the steps of:

nitridizing a surface of the substrate by exposing the surface to a nitrogen-comprising gas to form a first layer of silicon nitride on the surface of the substrate, the first silicon nitride layer having an exposed surface;

exposing the exposed surface of the first layer to a gas mixture of dichlorosilane and a nitrogen-comprising gas to deposit a second layer of silicon nitride on the exposed surface of the first layer, the second silicon nitride layer having an exposed surface; and exposing the exposed surface of the second layer to a gas mixture of silicon tetrachloride and a nitrogen-comprising gas to deposit a third layer of silicon nitride of a desired thickness on the surface of the exposed surface of the second layer, whereby the thickness of the third silicon nitride layer is substantially equivalent over each of the areas of the silicon-comprising substrate.

17. The method of claim 16, wherein a first area of the silicon-comprising substrate comprises an insulative material selected from the group consisting of tetraethylorthosilicate, borophosphosilicate glass, and silicon dioxide; and a second area of the silicon-comprising substrate comprises a silicon material selected from the group consisting of silicon, polysilicon, hemispherical grain polysilicon, a doped silicon, and a doped polysilicon.

18. A method of forming a silicon nitride-comprising layer on a silicon-comprising substrate, comprising the steps of:

nitridizing a surface of the silicon-comprising substrate to form a first silicon nitride layer having an exposed surface and a thickness of less than about 5 angstroms;

forming a second silicon nitride layer over the exposed surface of the first layer by chemical vapor deposition of dichlorosilane to a thickness of up to about 5 angstroms, the second silicon nitride layer having an exposed surface; and forming a third silicon nitride layer over the exposed surface of the second layer by chemical vapor deposition of silicon tetrachloride to a thickness of about 40 to about 50 angstroms;

the first, second and third layers together forming the silicon nitride-comprising layer.

19. A silicon nitride deposition method, comprising the steps of:

providing a silicon-comprising substrate;

nitridizing a surface of the silicon substrate to form a layer of silicon nitride having a thickness of up to about 5 angstroms, the nitridized layer having an exposed surface;

forming a silicon nitride-comprising layer on the exposed surface of the nitridized layer by a first chemical vapor deposition of dichlorosilane to form a first silicon nitride layer on the exposed surface of the nitridized layer, the first silicon nitride layer having an exposed surface and a thickness of 5 angstroms or less; and a second chemical vapor deposition of silicon tetrachloride to form a second silicon nitride layer on the exposed surface of the first layer, the second layer having a thickness of up to about 50 angstroms; the first and second layers forming the silicon nitride-comprising layer.

20. A method of semiconductive wafer processing, comprising forming a silicon nitride-comprising layer over a surface of a semiconductive wafer, the forming comprising the steps of:

forming a first portion of the silicon nitride-comprising layer of less than about 5 angstroms by nitridizing the surface of the semiconductive wafer, the first layer portion having an exposed surface;

depositing a second portion of the silicon nitride-comprising layer of less than about 5 angstroms on the exposed surface of the first layer portion, utilizing a mixture of dichlorosilane and a nitrogen-comprising gas, the second layer portion having an exposed surface; and depositing a third portion of the silicon nitride-comprising layer of up to about 50 angstroms on the exposed surface of the second layer portion utilizing a mixture of silicon tetrachloride and a nitrogen-comprising gas.

21. A method of forming a capacitor, comprising the steps of:

forming a silicon nitride-comprising layer over a surface of a first capacitor plate by depositing a first layer of the silicon nitride-comprising layer of less than about 5 angstroms on the surface of the capacitor plate, utilizing a mixture of dichlorosilane and a nitrogen-comprising gas, the first layer having an exposed surface; and depositing a second layer of the silicon nitride-comprising layer of up to about 50 angstroms on the exposed surface of the first layer, utilizing a mixture of silicon tetrachloride and a nitrogen-comprising gas, the second layer having an exposed surface; and forming a second capacitor plate over exposed surface of the second silicon nitride layer.

22. A method of forming a capacitor, comprising the steps of:

forming a first capacitor plate layer comprising a conductively doped polysilicon;

forming a silicon nitride-comprising layer over a surface of the first capacitor plate by depositing a first silicon nitride layer by low pressure chemical vapor deposition of dichlorosilane and one or more nitrogen-comprising gases to a thickness of less than about 5 angstroms on the surface of the capacitor plate, the first layer having an exposed surface; and depositing a second silicon nitride layer by low pressure chemical vapor deposition of silicon tetrachloride and one or more nitrogen-comprising gases to a desired thickness on the exposed surface of the first layer, the second layer having an exposed surface; and forming a second capacitor plate layer over the exposed surface of second silicon nitride layer.

23. A method of forming a capacitor, comprising the steps of:

forming a first capacitor plate having a surface;

forming a silicon nitride-comprising layer proximate the first capacitor plate by chemical vapor depositing dichlorosilane over the surface of the first capacitor plate to form a first silicon nitride layer of less than about 5 angstroms, the first layer having an exposed surface; and chemical vapor depositing silicon tetrachloride over the exposed surface of the first layer to form a second silicon nitride layer having an exposed surface and a desired thickness; and forming a second capacitor plate layer over the exposed surface of the second layer and proximate the silicon nitride-comprising layer.

24. A method of forming a capacitor, comprising the steps of:

forming a first capacitor plate having an exposed surface comprising at least two discrete areas of silicon-comprising materials having a different surface nucleation rate for silicon tetrachloride in a chemical vapor deposition to form a silicon nitride layer thereon;

forming a silicon nitride-comprising layer proximate the first capacitor plate by chemical vapor depositing dichlorosilane over the exposed surface of the first capacitor plate to form a first silicon nitride layer of less than about 5 angstroms, the first layer having an exposed surface; and chemical vapor depositing silicon tetrachloride onto the exposed surface of the first layer to form a second silicon nitride layer of a desired thickness, the second layer having an exposed surface; whereby the silicon nitride-comprising layer comprises the first and second layers and has a thickness that is substantially equivalent cross-wise over the surface of the first capacitor plate; and forming a second capacitor plate layer over the exposed surface of the second layer, proximate the silicon nitride-comprising layer.

25. A method of forming a capacitor, comprising the steps of:

forming a silicon nitride-comprising layer over a surface of a first capacitor plate by nitridizing the surface of the capacitor to form a first silicon nitride layer of less than about 5 angstroms, the first layer having an exposed surface; depositing a second layer of the silicon nitride-comprising layer of less than about 5 angstroms onto the exposed surface of the layer utilizing a mixture of dichlorosilane and a nitrogen-comprising gas, the second layer having an exposed surface; and depositing a third layer of the silicon nitride-comprising layer of up to about 50 angstroms onto the exposed surface of the second layer utilizing a mixture of silicon tetrachloride and a nitrogen-comprising gas, the third layer having an exposed surface; and forming a second capacitor plate over the exposed surface of the third silicon nitride layer.

26. A method of forming a capacitor, comprising the steps of:

forming a first capacitor plate layer comprising a conductively doped polysilicon;

forming a silicon nitride-comprising layer over a surface of the first capacitor plate by nitridizing the surface of the first capacitor plate to form a first silicon nitride layer of less than about 5 angstroms, the first layer having an exposed surface; depositing a second silicon nitride layer onto the exposed surface of the first layer by low pressure chemical vapor deposition of dichlorosilane and one or more nitrogen-comprising gases to a thickness of less than about 5 angstroms, the second layer having an exposed surface; and depositing a third silicon nitride layer onto the exposed surface of the second layer by low pressure chemical vapor deposition of silicon tetrachloride and one or more nitrogen-comprising gases to a desired thickness, the third layer having an exposed surface; and forming a second capacitor plate layer over the exposed surface of the third silicon nitride layer.

27. A method of forming a capacitor, comprising the steps of:

forming a first capacitor plate having a silicon-comprising surface;

forming a silicon nitride-comprising layer proximate the first capacitor plate by nitridizing the surface of the first capacitor plate to form a first silicon nitride layer of less than about 5 angstroms, the first layer having an exposed surface; chemical vapor depositing dichlorosilane over the exposed surface of the first layer to form a second silicon nitride layer of less than about 5 angstroms, the second layer having an exposed surface; and chemical vapor depositing silicon tetrachloride over the exposed surface of the second layer to form a silicon nitride layer of a desired thickness; and forming a second capacitor plate layer proximate the silicon nitride-comprising layer.

28. A method of forming a capacitor, comprising the steps of:

forming a first capacitor plate having an exposed surface comprising at least two discrete areas of silicon-comprising materials having a different surface nucleation rate for silicon tetrachloride in a chemical vapor deposition to form a silicon nitride layer thereon;

forming a silicon nitride-comprising layer proximate the first capacitor plate by nitridizing the exposed surface of the first capacitor plate to form a first silicon nitride layer having a thickness of less than about 5 angstroms, the first layer having an exposed surface; chemical vapor depositing dichlorosilane over the exposed surface of the first layer to form a second silicon nitride layer having a thickness of less than about 5 angstroms, the second layer having an exposed surface; and chemical vapor depositing silicon tetrachloride over the exposed surface of the second layer to form a third silicon nitride layer of a desired thickness; whereby the combined thicknesses of the first, second and third layers provides the silicon nitride-comprising with a thickness that is substantially equivalent cross-wise over the surface of the first capacitor plate; and forming a second capacitor plate layer proximate the silicon nitride-comprising layer.

29. A method of forming a nitride layer on a silicon-comprising substrate, comprising the steps of:

depositing dichlorosilane and a nitrogen-comprising gas onto the substrate to form a first nitride layer; and depositing silicon tetrachloride and a nitrogen-comprising gas onto the first nitride layer to form a second nitride layer.

30. The method of claim 29, wherein the steps of depositing is by chemical vapor deposition at a temperature of about 600° C. to about 800° C., and a pressure of about 50 mTorr to about 1500 mTorr.

31. The method of claim 29, wherein the nitrogen-comprising gas comprises ammonia.

32. The method of claim 29, wherein the first nitride layer has a thickness of about 3 to about 8 angstroms.

33. The method of claim 31, wherein the first nitride layer has a thickness of about 45 to about 55 angstroms.

34. A method of forming a nitride layer on a silicon-comprising substrate comprising at least two areas of materials having different nitride nucleation rates, the method comprising the steps of:

depositing dichlorosilane and a nitrogen-comprising gas onto the substrate to form a first nitride layer over the at least two areas; and depositing silicon tetrachloride and a nitrogen-comprising gas onto the first nitride layer to form a second nitride layer, whereby the second nitride layer has a thickness substantially equivalent over the at least two areas.

35. The method of claim 34, wherein the substrate comprises a first area comprising an insulative material and a second area comprising a silicon material.

36. The method of claim 35, wherein the insulative material is selected from the group consisting of tetraethylorthosilicate, borophosphosilicate glass, and silicon dioxide; and the silicon material is selected from the group consisting of silicon, polysilicon, hemispherical grain polysilicon, a doped silicon, and a doped polysilicon.

37. The method of claim 34, wherein the substrate comprises a first area comprising borophosphosilicate glass and a second area comprising hemispherical grain polysilicon.

38. A method of forming a nitride layer on a silicon-comprising substrate, comprising the steps of:

exposing the substrate to a nitrogen-comprising gas to form a first nitride layer;

exposing the substrate to dichlorosilane and a nitrogen-comprising gas to deposit a second nitride layer over the first nitride layer; and exposing the substrate to silicon tetrachloride and a nitrogen-comprising gas to deposit a third nitride layer over the second nitride layer.

39. The method of claim 38, wherein the nitrogen-comprising gas to form the first nitride layer is selected from the group consisting of $N_2$, $NH_3$, $NO_x$, and mixtures thereof.

40. The method of claim 38, wherein the step of exposing the substrate to form the first nitride layer is by rapid thermal nitridation at a temperature of about 900° C. to about 1300° C., and a pressure of about 100 Torr to about 760 Torr.

41. A method of forming a nitride layer on a silicon-comprising substrate comprising at least two areas of materials having different nitride nucleation rates, the method comprising the steps of:

exposing the substrate to a nitrogen-comprising gas to form a first nitride layer over the at least two areas;

exposing the substrate to dichlorosilane and a nitrogen-comprising gas to deposit a second nitride layer over the first nitride layer; and exposing the substrate to silicon tetrachloride and a nitrogen-comprising gas to deposit a third nitride layer over the second nitride layer; whereby the third layer has a thickness substantially equivalent over the at least two areas of silicon-comprising materials.

42. The method of claim 41, wherein the substrate comprises a first area comprising an insulative material selected from the group consisting of tetraethylorthosilicate, borophosphosilicate glass, and silicon dioxide; and a second area comprising a silicon material selected from the group consisting of tetraethylorthosilicate, borophosphosilicate glass, and silicon dioxide selected from the group consisting of silicon, polysilicon, hemispherical grain polysilicon, a doped silicon, and a doped polysilicon.

43. The method of claim 41, wherein the substrate comprises a first area comprising borophosphosilicate glass and a second area comprising hemispherical grain polysilicon.

44. A silicon nitride deposition method, comprising the steps of:

providing a silicon-comprising substrate;

forming a first nitride layer over the substrate by chemical vapor deposition of dichlorosilane and a nitrogen-containing gas onto the substrate; and forming a second nitride layer by chemical vapor deposition of silicon tetrachloride and a nitrogen-containing gas onto the first nitride layer.

45. A silicon nitride deposition method, comprising the steps of:

providing a silicon-comprising substrate;

nitridizing the substrate to form a first nitride layer;

forming a second nitride layer over the first nitride layer by exposing the substrate to dichlorosilane and a nitrogen-containing gas, wherein the second nitride layer has a thickness of 5 angstroms or less; and forming a third nitride layer over the second nitride layer by exposing the substrate to silicon tetrachloride and a nitrogen-containing gas, wherein the third layer has a thickness of up to about 50 angstroms.

46. A silicon nitride deposition method, comprising the steps of:

providing a silicon-comprising substrate comprising at least two areas of materials having different nitride nucleation rates;

nitridizing the substrate to form a first nitride layer over the at least two areas;

forming a second nitride layer over the first nitride layer by exposing the substrate to dichlorosilane and a nitrogen-containing gas, wherein the second nitride layer has a thickness of 5 angstroms or less; and forming a third nitride layer over the second nitride layer by exposing the substrate to silicon tetrachloride and a nitrogen-containing gas, wherein the third layer has a thickness of up to about 50 angstroms;

whereby the third nitride layer has a cross-substrate thickness that is substantially equivalent over each of the at least two areas of silicon-comprising materials.

47. A method of forming a capacitor, comprising the steps of:

forming a first nitride layer over a lower electrode by exposing the lower electrode to dichlorosilane and a nitrogen-comprising gas; and forming a second nitride layer over the first nitride layer by exposing the first nitride layer to silicon tetrachloride and a nitrogen-comprising gas.

48. The method of claim 47, wherein the first nitride layer is about 3 to about 8 angstroms thick, and the second nitride layer is up to about 50 angstroms thick.

49. A method of forming a capacitor, comprising the steps of:

forming a first nitride layer over a lower electrode by chemical vapor deposition of dichlorosilane and a nitrogen-comprising gas onto the lower electrode to a thickness of 3 to about 8 angstroms; and forming a second nitride layer by chemical vapor deposition of silicon tetrachloride and a nitrogen-comprising gas onto the first nitride layer to a thickness of up to about 50 angstroms.

50. A method of forming a capacitor, comprising the steps of:

providing a substrate comprising an insulative material and an opening formed therein, and a lower electrode comprising a silicon-comprising material formed within the opening;

depositing dichlorosilane and a nitrogen-comprising gas to form a first nitride layer over the substrate and the lower electrode; and depositing silicon tetrachloride and a nitrogen-comprising gas onto the first nitride layer to form a second nitride layer;

whereby the second nitride layer has a thickness that is substantially equivalent over the lower electrode and the insulative material of the substrate.

51. The method of claim 50, wherein the insulative material is selected from the group consisting of tetraethylorthosilicate, borophosphosilicate glass, and silicon dioxide; and the silicon-comprising material is selected from the group consisting of silicon, polysilicon, hemispherical grain polysilicon, doped silicon, and doped polysilicon.

52. The method of claim 50, wherein the insulative material comprises borophosphosilicate glass and the silicon-comprising material comprises hemispherical grain polysilicon.

53. A method of forming a capacitor, comprising the steps of:

providing a substrate comprising an insulative material and an opening formed therein, and a lower electrode comprising a silicon-comprising material formed within the opening;

exposing the substrate and the lower electrode to a nitrogen-comprising gas to form a first nitride layer over the substrate and the lower electrode;

depositing dichlorosilane and a nitrogen-comprising gas onto the first nitride layer to form a second nitride layer; and depositing silicon tetrachloride and a nitrogen-comprising gas onto the second nitride layer to form a third nitride layer;

whereby the third nitride layer has a thickness that is substantially equivalent over the lower electrode and the insulative material of the substrate.

54. The method of claim 53, wherein the insulative material is selected from the group consisting of tetraethylorthosilicate, borophosphosilicate glass, and silicon dioxide; and the silicon-comprising material is selected from the group consisting of silicon, polysilicon, hemispherical grain polysilicon, doped silicon, and doped polysilicon.

* * * * *

UNITED STATES PATENT AND TRADEMARK OFFICE
CERTIFICATE OF CORRECTION

PATENT NO.    : 6,465,373 B1
DATED         : October 15, 2002
INVENTOR(S)   : Lingyi A. Zheng et al.

It is certified that error appears in the above-identified patent and that said Letters Patent is hereby corrected as shown below:

Column 2,
Line 49, after "(about" add -- 15 --.

Column 7,
Line 11, replace "$NH_3:SiH_{2Cl2}$" with -- $NH_3:SiH_2Cl_2$ --.
Line 34, replace "$NH3: SiCl_4$" with -- $NH_3: SiCl_4$ --.

Signed and Sealed this

Seventh Day of January, 2003

JAMES E. ROGAN
*Director of the United States Patent and Trademark Office*